United States Patent
Kang et al.

(10) Patent No.: US 7,112,390 B2
(45) Date of Patent: Sep. 26, 2006

(54) METHOD OF MANUFACTURING CHROMELESS PHASE SHIFT MASK

(75) Inventors: Myung-Ah Kang, Busan (KR); In-Kyun Shin, Yongin (KR)

(73) Assignee: Samsung Electronics Co., Ltd., Suwon-si (KR)

(*) Notice: Subject to any disclaimer, the term of this patent is extended or adjusted under 35 U.S.C. 154(b) by 227 days.

(21) Appl. No.: 10/368,630

(22) Filed: Feb. 20, 2003

(65) Prior Publication Data

US 2004/0009412 A1  Jan. 15, 2004

(30) Foreign Application Priority Data

Jul. 15, 2002 (KR) ............... 10-2002-0041226

(51) Int. Cl.
*G01F 9/00* (2006.01)
(52) U.S. Cl. ............................................. 430/5
(58) Field of Classification Search ........... 430/30, 430/5
See application file for complete search history.

(56) References Cited

U.S. PATENT DOCUMENTS

| | | | | |
|---|---|---|---|---|
| 4,479,848 A | * | 10/1984 | Otsubo et al. | 438/16 |
| 5,674,652 A | * | 10/1997 | Bishop et al. | 430/30 |
| 5,686,206 A | * | 11/1997 | Baum et al. | 430/5 |
| 6,016,357 A | | 1/2000 | Neary et al. | |
| 6,902,851 B1 | * | 6/2005 | Babcock et al. | 430/5 |

* cited by examiner

*Primary Examiner*—S. Rosasco
(74) *Attorney, Agent, or Firm*—Volentine Francos & Whitt, PLLC (57) ABSTRACT

A method of manufacturing a chromeless phase shift mask includes forming a photoresist film pattern on a wafer using a basic form of the chromeless phase shift mask and measuring a specification of the photoresist film pattern. The basic form of the chromeless phase shift mask is isotropically etched to modify the phase shifter of the mask unless the photoresist film pattern specification is within a specified range. Accordingly, an application-specific chromeless phase shift mask can be produced for use in any exposure apparatus and under any exposure condition.

10 Claims, 6 Drawing Sheets

METHOD OF MANUFACTURING CHROMELESS PHASE SHIFT MASK

BACKGROUND OF THE INVENTION

1. Field of the Invention

The present invention relates to the photolithography process used to manufacture semiconductor devices, for example. More particularly, the present invention relates to a method of manufacturing a phase shift mask of a photolithographic exposure apparatus.

2. Description of the Related Art

A photolithography process for fabricating a micro circuit (pattern) on a wafer is a principal part of a semiconductor manufacturing process. In addition, the quality of the photolithography process is a major factor influencing the quality and yield of semiconductor chips.

The photolithography process employs a mask by which a micro pattern can be transferred to a wafer. In general, a chrome mask is used. The chrome mask comprises a chrome pattern formed on a quartz substrate. However, due to the way in which it diffracts light, a basic chrome mask cannot be used in providing the higher degree of resolution required to meet today's demand for highly integrated chips. The phase shift mask has been developed to overcome such limitations.

There are various kinds of phase shift masks. One type of phase shift mask is a chromeless phase shift mask, which uses only a phase shifter (a phase shift pattern) to transcribe a micro pattern on a wafer. The phase shifter of the chromeless phase shift mask is formed by etching a mask substrate to a predetermined depth. In other words, the phase shifter constituting a phase shift area of the chromeless phase shift mask comprises a trench formed by etching the mask substrate to a predetermined depth.

However, when a photoresist film pattern is formed on a wafer using an exposure apparatus that employs a chromeless phase shift mask to this end, there is a difference between the critical dimension or critical dimension uniformity of the photoresist pattern and that of the phase shifter of the chromeless phase shift mask. The extent of this difference depends on the exposure apparatus or exposure conditions.

Accordingly, the specifications of the mask, including the critical dimension or the critical dimension uniformity of the phase shifter, must be adjusted after the mask is manufactured to, in turn, ultimately provide a mask that will form a photoresist film pattern having the desired critical dimension or the critical dimension uniformity.

SUMMARY OF THE INVENTION

An object of the present invention to provide a method of manufacturing a chromeless phase shift mask that can be used to produce a pattern on a wafer that conforms very highly to the design rule.

According to one aspect of the present invention, a method of manufacturing a chromeless phase shift mask begins by designing the chromeless phase shift mask, i.e., establishing the specifications of the mask. Then, a basic form of the designed chromeless phase shift mask is manufactured. Next, a photoresist film pattern is formed on a wafer by a photolithography process in which exposure light is directed onto a photoresist layer through the manufactured basic form of the chromeless phase shift mask. The photoresist film pattern is analyzed to quantify or otherwise measure a specification of the photoresist film pattern. The photoresist film pattern specification may be any one of the critical dimension of the photoresist film pattern, the average value of the critical dimension of the photoresist film pattern or a measure of the uniformity of the critical dimension of the photoresist film pattern. Then, a determination is made as to whether the specification of the photoresist film pattern is within a specified range, i.e., is within a certain deviation. Finally, the basic form of the chromeless phase shift mask is modified unless the photoresist film pattern specification is within the predetermined allowed for range. In this case, the phase shifter is modified without altering its phase shift characteristic, namely the degree to which it changes the phase of incident exposure light.

In another aspect of the present invention, a design specification of the basic form of the phase shift mask itself is measured or otherwise quantified before the photolithography process. The design specification of the basic form of the mask may be any one of the critical dimension of the phase shifter, the average value of the critical dimension of the phase shifter or a measure of the uniformity of the critical dimension of the phase shifter. The mask is modified before the photolithography process unless the design specification is within a predetermined range. In this case, as well, the modification of the basic form of the phase shift mask entails modifying the phase shifter without altering its phase shift characteristic.

The phase shifter is typically a trench formed by etching a mask substrate to a predetermined depth. In this case, the basic form of the phase shift mask can be modified, without altering the phase shift characteristic of the trench, by selectively wet etching the mask substrate.

As described above, the method of the present invention includes ascertaining a specification of a photoresist film pattern produced using a basic form of the phase shift mask, or specifications of both a photoresist pattern and the basic form of the mask itself, and modifying the mask to change a specification thereof without altering the phase change characteristic of the phase shifter when the specification(s) deviates too much form a certain value. Accordingly, an application-specific chromeless phase shift mask can be manufactured.

BRIEF DESCRIPTION OF THE DRAWINGS

The above and other objects and advantages of the present invention will become more apparent from the following detailed description of the preferred embodiments thereof made with reference to the attached drawings, of which.

DETAILED DESCRIPTION OF THE PREFERRED EMBODIMENTS

The present invention now will be described more fully with reference to the accompanying drawings. In the drawings, the thickness of layers and regions are exaggerated for clarity. It will also be understood that when a layer is referred to as being "on" another layer or substrate, such a description includes the layer in question being disposed directly on the other layer or substrate, or intervening layers being present therebetween.

Figure 1A:
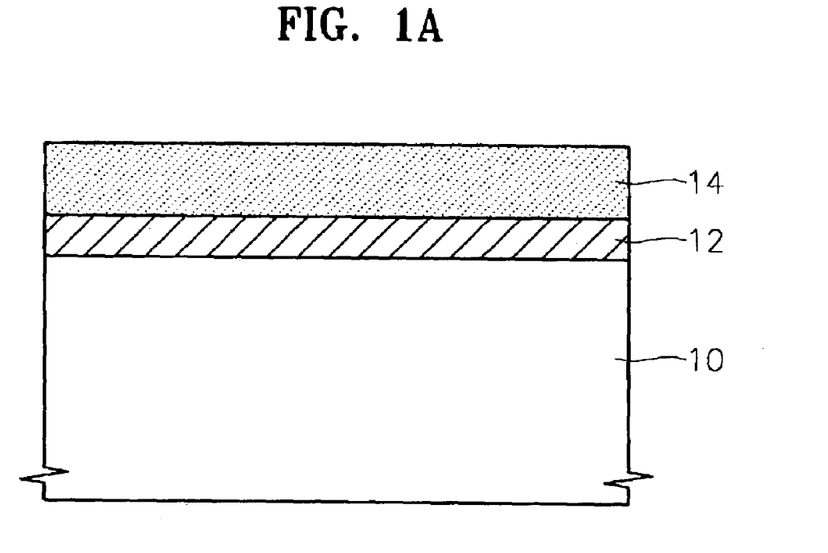
FIGS. 1A through 1F are sectional views illustrating a method of manufacturing a chromeless phase shift mask according to the present invention.
Figure 1B:
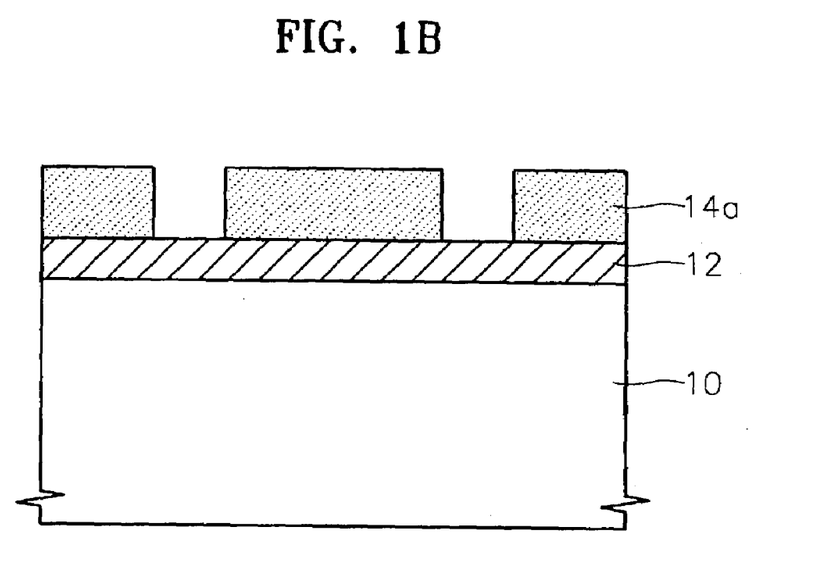

Referring first to FIGS. 1A and 1B, a chromium layer 12 and a photoresist film 14 are formed on a mask substrate 10, such as a quartz substrate. Then a photoresist film pattern 14a is formed by patterning the photoresist film 14 using a typical photolithography process.

Figure 1C:
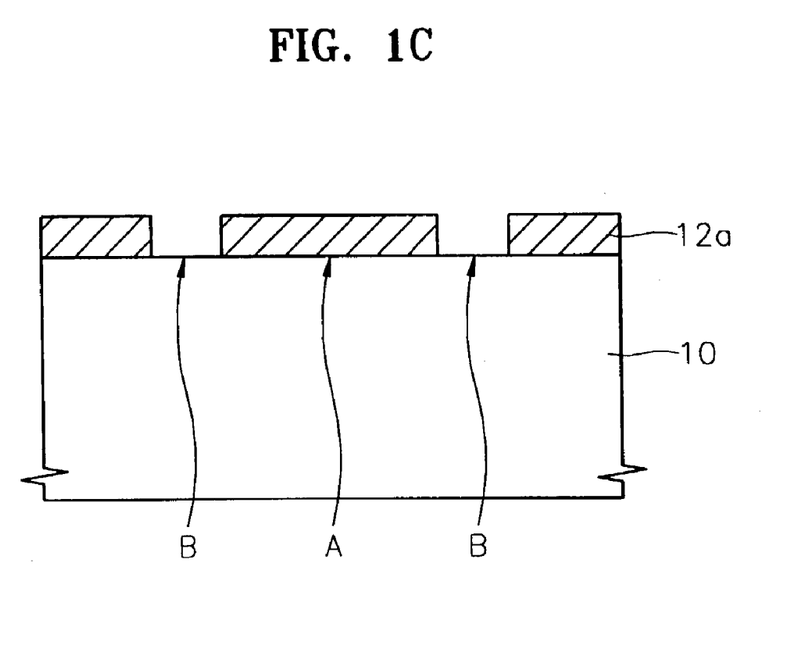

Referring to FIG. 1C, the chromium layer 12 is etched using the photoresist film pattern 14a as a mask to form a chromium pattern 12a delimiting a 0° phase shift area "A" and a 180° phase shift area "B". Subsequently, the photoresist film pattern 14a is removed and then a cleaning process is performed to clean the exposed surfaces of the substrate 10.

Figure 1D:
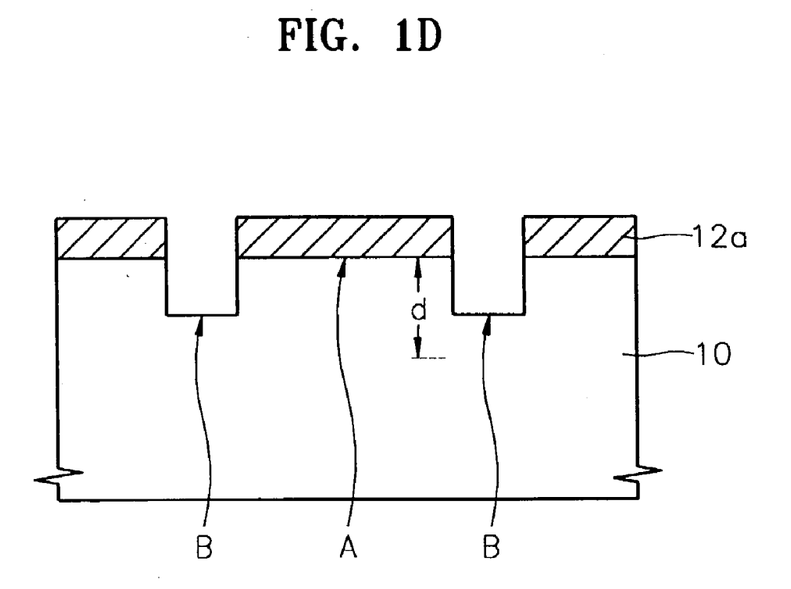
Figure 1E:
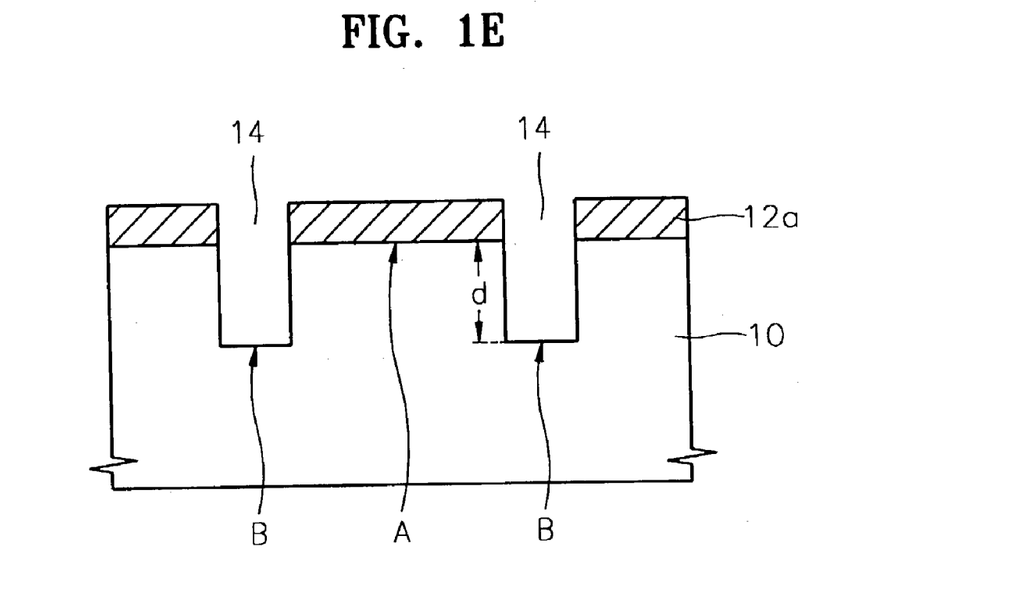

Referring to FIGS. 1D and 1E, the area of the mask substrate 10 exposed by the chromium pattern 12a and corresponding to the 180° phase shift area "B" is etched to a predetermined depth 'd' using a multi-step etching technique. The predetermined depth 'd' of the resulting trench is that by which the mask will produce a 180° shift in the phase of the exposure light that is transmitted through the mask via the trench. FIG. 1D shows the mask substrate 10 etched to a depth less than the predetermined depth 'd' in the course of the above-mentioned multi-step etching technique. On the other hand, FIG. 1E shows the mask substrate 10 etched to the predetermined depth 'd'.

The reason why the quartz substrate 10 is first etched shallower than depth 'd' is as follows. Particles can be generated on the surface of the quartz substrate 10 during the etching process of patterning the chromium layer 12. If the quartz substrate 10 were subjected to the etching process while the particles were present on the surface of the substrate 10, the portion of the quartz substrate 10 under the particles would not be etched because the particles would act as a mask.

Isotropic etching has been suggested as a way to overcome this potential problem. However, isotropic etching results in the extension of an etching region and thus is difficult to adapt for use in forming a phase shift mask having a very fine pattern. Accordingly, when forming the phase shift mask according to the present invention, the quartz substrate 10 is anisotropically etched throughout part of its thickness (FIG. 1D), particles on its surface are removed by a cleaning process, and then the quartz substrate 10 is etched again (FIG. 1E).

Figure 1F:
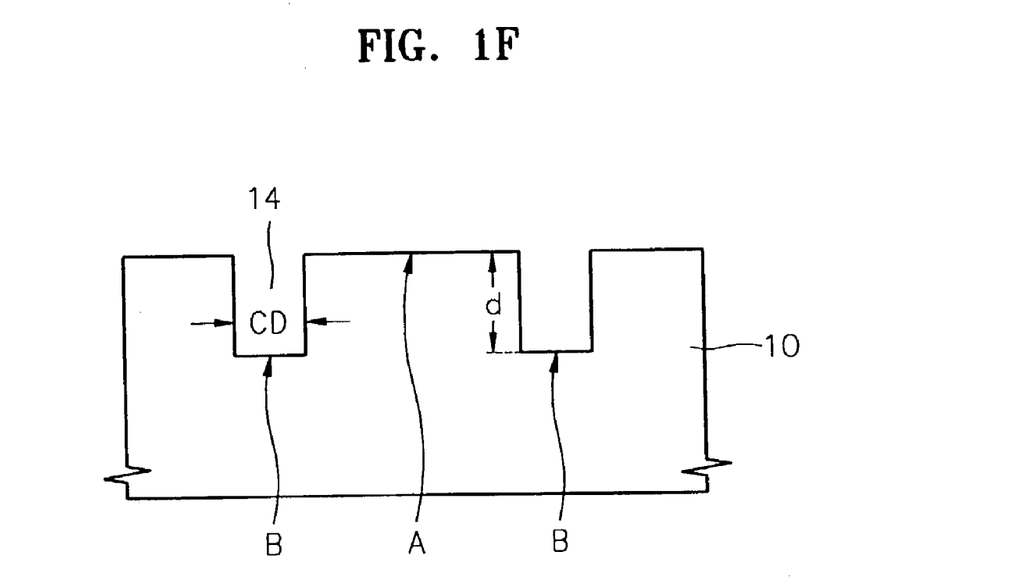

Referring now to FIG. 1F, the chromium pattern 12a is removed. Hence, the area "B" of the mask in which the trench 14 is formed becomes the a 180° phase shift region and the exposed area "A" of the surface of the mask substrate 10 becomes the 0 phase shift region, namely, a region where the transmitted exposure light will not undergo a phase shift.

However, the actual values of the specifications of the chromeless phase shift mask, such as the critical dimension (CD), the average value and the uniformity of the phase shifter, differ from the design values of these specifications due to limitations in the above-described techniques used to manufacture the mask. For example, the overall uniformity of the critical dimension of the chromeless phase shift mask (the phase shifter 14) may be low in a specific area. Accordingly, it is necessary to modify the mask to attain an optimum specification so that the mask will produce a photoresist film pattern having desired specifications, such as a particular critical dimension, average value of the critical dimension or uniformity of the critical dimension.

Figure 2:
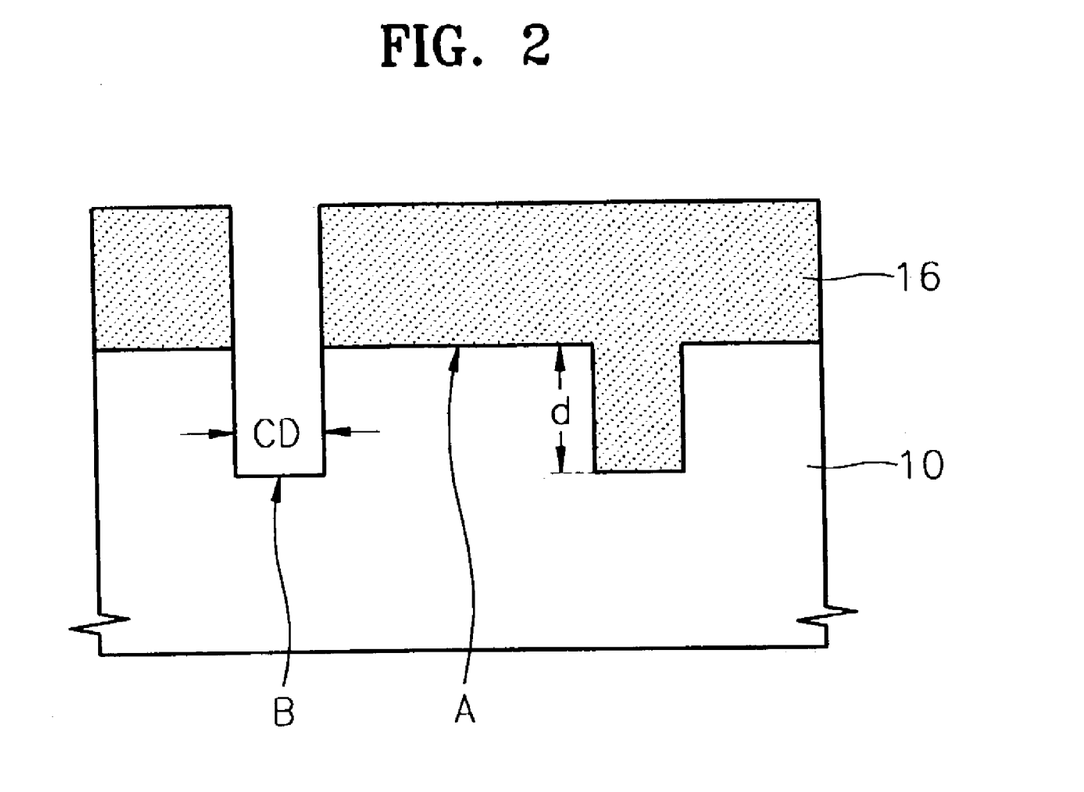
FIG. 2 is a sectional view illustrating a method of modifying a mask specification of a chromeless phase shift mask according to the present invention.

FIG. 2 illustrates the way in which the specification of a chromeless phase shift mask is modified according to the present invention. More specifically, a photoresist film pattern 16, which exposes one part of the trench 14, is formed on the mask substrate 10 using a photolithography process. Then, the critical dimension (CD) of that part of the trench 14 is modified by wet etching the mask substrate 10 using the photoresist film pattern 16 as an etch mask. The wet etching is performed using a solution of hydrofluoric acid. The effect of this wet etching process is isotropic, so that the difference, in terms of phase change, between the 0° phase shift region "A" and the 180° phase shift region "B" is maintained. That is, according to the present invention, the mask specification is changed without changing the phase shifts that will be created at the various regions of the mask. Finally, the photoresist film pattern 16 is removed.

Figure 3:
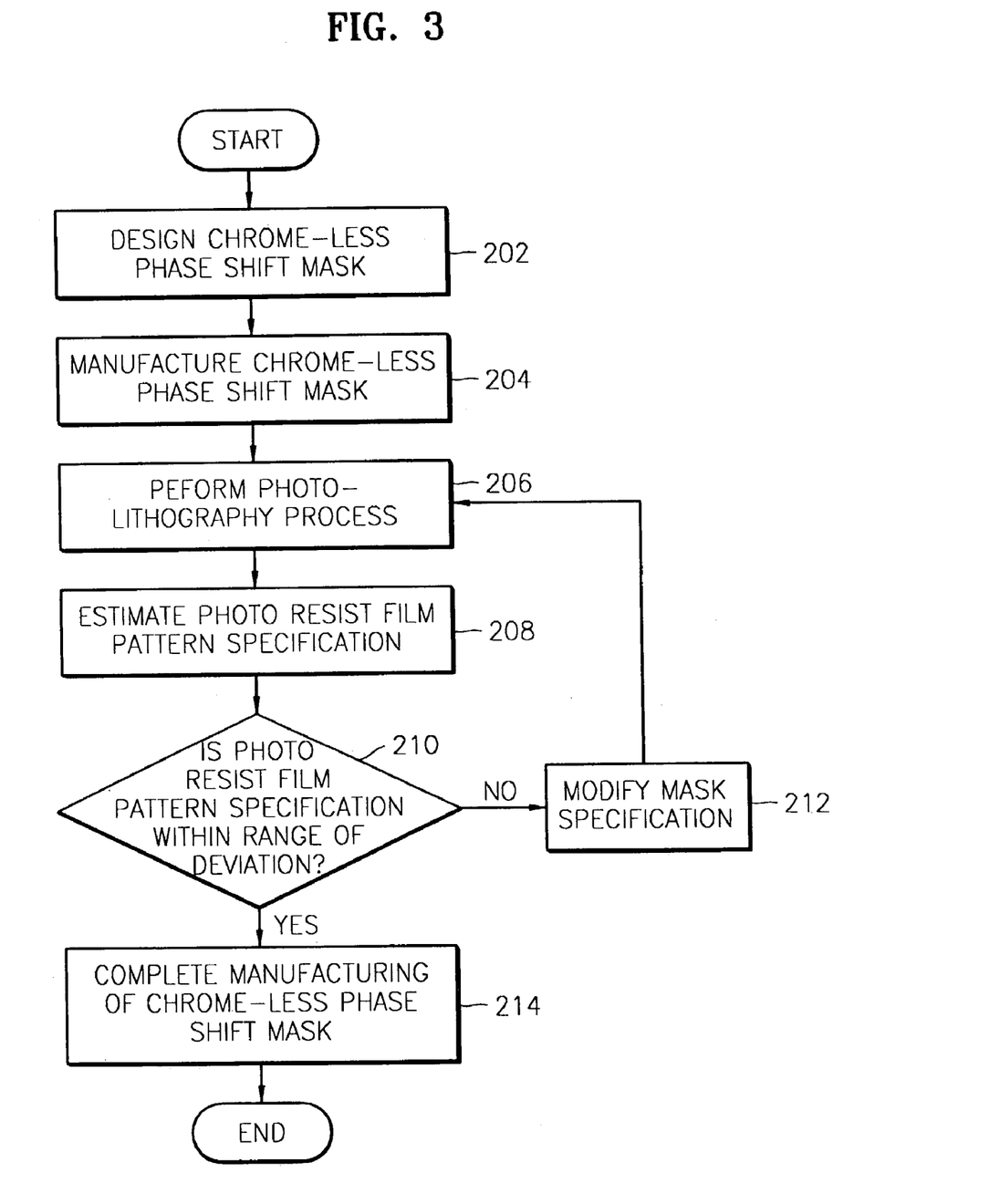
FIG. 3 is a flowchart of a method for manufacturing a chromeless phase shift mask according to the present invention.

FIG. 3 is a detailed flowchart of the method of manufacturing a chromeless phase shift mask according to the present invention.

First, a chromeless phase shift mask is designed using a CAD (Computer Aided Design) program (step 202). Then, the chromeless phase shift mask is manufactured by the methods described with reference to FIGS. 1A through 1F (step 204).

Next, a photolithography process is performed, in which a photoresist film on a wafer is exposed to light directed through the chromeless phase shift mask, and the exposed photoresist film is developed to form a photoresist film pattern (step 206). Then a specification of the photoresist film pattern, such as the critical dimension, the average value of the critical dimension and/or the uniformity of the critical dimension of the photoresist pattern, is measured (step 208). The photoresist film pattern specification depends on the type of exposure apparatus, the exposure conditions, and the specifications of the chromeless phase shift mask.

A determination is made as to whether the measured photoresist film pattern specification is within the specified range (step 210). The mask is modified by the process shown in FIG. 2 unless the photoresist film pattern specification is within the specified range (step 212). Again, the mask is modified by selectively wet etching the phase shifter without producing any change in the phase shifts produced by the various regions of the mask.

After the mask is modified, another photolithography process is performed in which a photoresist film on the wafer is exposed to light passed through the modified mask, and is developed to form a photoresist film pattern. If the specification of the photoresist film is within the specified range, the manufacturing of the chromeless phase shift mask is deemed complete (step 214).

Figure 4:
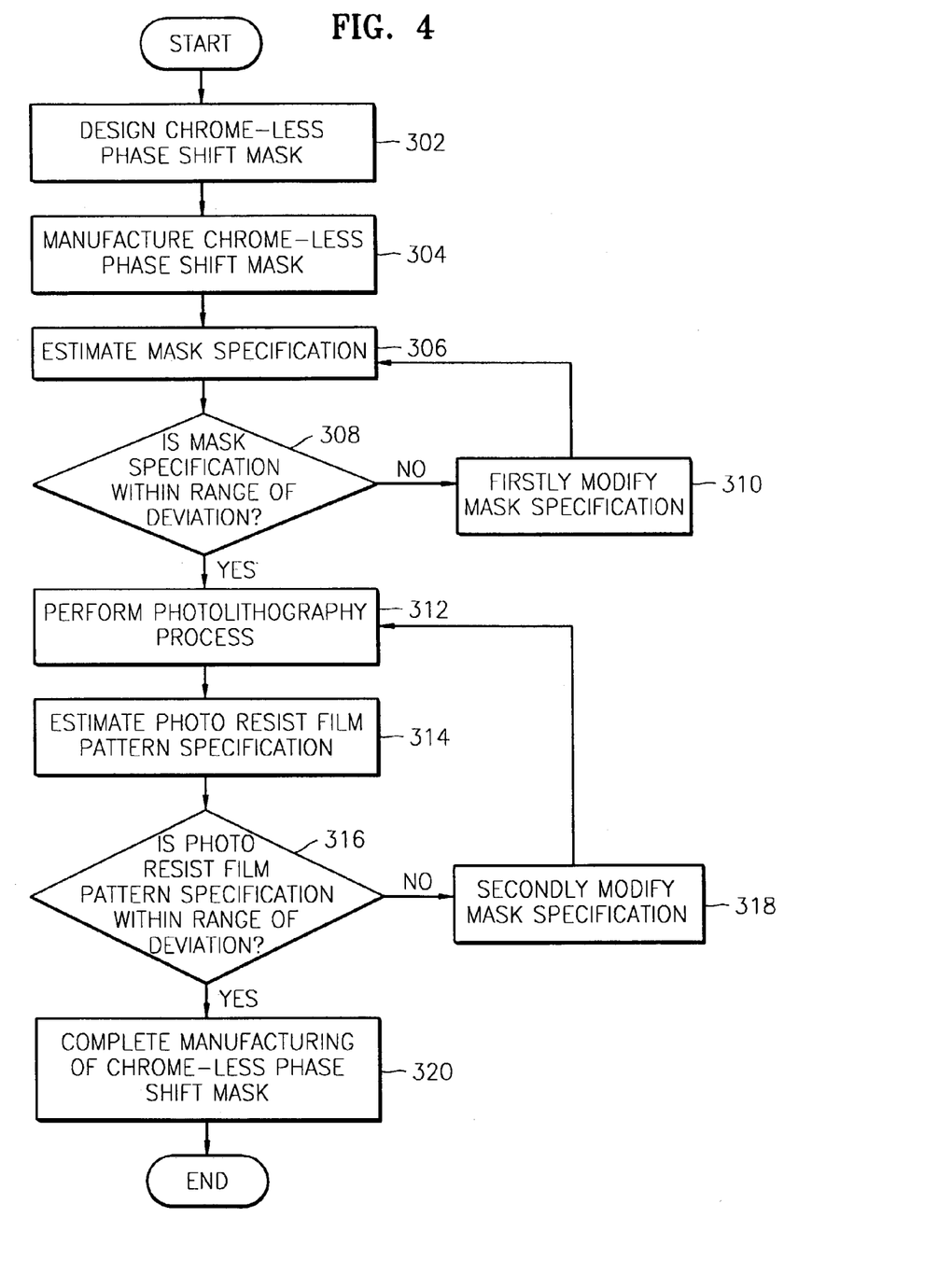
FIG. 4 is a flowchart of another embodiment of a method for manufacturing a chromeless phase shift mask according to the present invention.

FIG. 4 is a detailed flowchart of another method of manufacturing a chromeless phase shift mask according to the present invention.

First, a chromeless phase shift mask is designed using a CAD (Computer Aided Design) program (step 302). Then, the chromeless phase shift mask is manufactured by the method described with reference to FIGS. 1A through 1F (step 304).

Next, the specifications of the chromeless phase shift mask, such as the critical dimension, the average value of the critical dimension and/or the uniformity of the critical dimension of the phase shifter of the mask, is measured (step 306).

A determination is then made as to whether the mask specification is within a specified range (step 310). The mask is modified, using the process described in connection with FIG. 2, unless the mask specification is within the specified range (step 310). That is, the mask specification is modified by selectively wet etching the substrate (the phase shifter). Subsequently, the specification of the mask is measured again.

Once the mask specification is within the specified range, a photolithography process is performed in which a photoresist film on the wafer is exposed to light directed through the mask, and the photoresist film is developed to form a photoresist film pattern (step 312). Then, the specification of the photoresist film pattern, such as the critical dimension, the average value of the critical dimension and/or the uniformity of the critical dimension of the photoresist pattern, is measured (step 314).

Then, a determination is made as to whether the photoresist film pattern specification is within a specified range (step 316). The mask is modified, again by the process described with reference to FIG. 2, unless the photoresist film pattern specification is within the specified range of deviation (step 318).

After the mask is thus modified, the photolithography process is performed on a photoresist film on a wafer using light directed through the so-modified mask. If the specification of the resultant photoresist film is within a specified range, the manufacturing of the chromeless phase shift mask is deemed complete (step 320).

As described above, according to the present invention, a photoresist film pattern is formed on a wafer by a photolithographic process that employs a chromeless phase shift mask, a specification of the photoresist film pattern is measured, and the mask is isotropically etched when the specification of the photoresist film pattern is outside a predetermined range. Modifying the mask specification in this way makes it possible to obtain an application-specific chromeless phase shift mask. That is, a basic phase shift mask can be adapted for use in any exposure device and under various exposure conditions by practicing the present invention.

Finally, although the present invention has been particularly shown and described with reference to the preferred embodiment thereof, the invention may, however, be embodied in many different forms readily apparent to those skilled in the art that. Thus, various changes in form and details may be made in the present invention without departing from the true spirit and scope of the invention as defined by the appended claims.

What is claimed is:

1. A method of manufacturing an application-specific chromeless phase shift mask which is adaptively configured for use in any of plural exposure devices and any of plural exposure conditions, comprising:

designing a chromeless phase shift mask having a phase shifter which will change the phase of exposure light transmitted therethrough;

manufacturing a basic form of the chromeless phase shift mask according to said designing;

forming a photoresist film pattern on a wafer by a photolithographic process in which exposure light is directed onto a photoresist layer on the wafer through the basic form of the phase shift mask;

measuring a specification of the photoresist film pattern;

making a decision on whether the basic form of the chromeless phase shift mask on the basis of a determination as to whether the specification of the photoresist film pattern is within a predetermined range; and modifying the chromeless phase shift mask in a manner that changes a specification of the basic form of the mask without altering the phase shift characteristics of the mask, unless the measured specification of the photoresist film pattern is within said predetermined range, to obtain the application-specific chromeless phase shift mask.

2. The method of claim 1, wherein the specification of the photoresist film pattern specification is a critical dimension of the photoresist film pattern, an average value of the critical dimension of the photoresist film pattern or a measure of the uniformity of the critical dimension of the photoresist film pattern.

3. The method of claim 1, wherein the specification of the basic form of the mask is a critical dimension of the phase shifter, an average value of the critical dimension of the phase shifter or a measure of the uniformity of the critical dimension of the phase shifter.

4. The method of claim 3, wherein said manufacturing the basic form of the phase shift mask comprises etching a mask substrate to form a trench that constitutes the phase shifter.

5. The method of claim 4, wherein said modifying the basic form of the mask comprises selectively wet etching the mask substrate to modify a specification of the phase shifter.

6. A method of manufacturing an application-specific chromeless phase shift mask which is adaptively configured for use in any of plural exposure devices and any of plural exposure conditions, comprising:

designing a chromeless phase shift mask having a phase shifter which will change the phase of exposure light transmitted therethrough;

manufacturing a basic form of the chromeless phase shift mask according to said designing;

measuring a specification of the basic form of the chromeless phase shift mask;

making a first decision on whether to modify the basic form of the chromeless phase shift mask on the basis of a determination as to whether the specification of the basic form of the chromeless phase shift mask is within a predetermined range;

modifying the basic form of the chromeless phase shift mask in a manner that changes a specification of the basic form of the mask without altering the phase shift characteristics of the mask, unless the measured specification of the basic form of the chromeless phase shirt mask is within said predetermined range;

subsequently forming a photoresist film pattern on a wafer by a photolithographic process in which exposure light is directed onto a photoresist layer on the wafer through the basic form of the phase shift mask regardless of whether the basic form of the phase shift mask has been modified;

measuring a specification of the photoresist film pattern;

making a second decision on whether to modify the basic form of the chromeless phase shift mask on the basis of a determination as to whether the measured specification of the photoresist film pattern is within a second predetermined range; and modifying the basic form of the chromeless phase shift mask in a manner that changes a specification of the basic form of the mask without altering the phase shift characteristics of the mask, unless the measured specification of the photoresist film pattern specification is within said second predetermined range, to obtain the application-specific chromeless phase shift mask.

7. The method of claim 6, wherein the specification of the basic form of the mask is a critical dimension of the phase shifter, an average value of the critical dimension of the phase shifter or a measure of the uniformity of the critical dimension of the phase shifter.

8. The method of claim 7, wherein said manufacturing the basic form of the phase shift mask comprises etching a mask substrate to form a trench that constitutes the phase shifter.

9. The method of claim 8, wherein said modifying the basic form of the phase shift mask comprises wet etching the mask substrate to modify a specification of the phase shifter.

10. The method of claim 6, wherein said specification of the photoresist film pattern is a critical dimension of the photoresist film pattern, an average value of the critical dimension of the photoresist film pattern or a measure of the uniformity of the critical dimension of the photoresist film pattern.

* * * * *